(12) United States Patent
Grant et al.

(10) Patent No.: US 12,107,583 B1
(45) Date of Patent: Oct. 1, 2024

(54) TOTAL IONIZING DOSE SHUTDOWN SYSTEM AND METHOD

(71) Applicant: Apogee Semiconductor, Inc., Plano, TX (US)

(72) Inventors: David A. Grant, Dallas, TX (US); Mark Hamlyn, Murphy, TX (US); Kyle Schulmeyer, Murphy, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 0 days.

(21) Appl. No.: 18/627,080

(22) Filed: Apr. 4, 2024

(51) Int. Cl.
| H03K 5/1252 | (2006.01) |
| H03K 5/08 | (2006.01) |
| H03K 5/24 | (2006.01) |

(52) U.S. Cl.
CPC ........... *H03K 5/1252* (2013.01); *H03K 5/082* (2013.01); *H03K 5/2472* (2013.01)

(58) Field of Classification Search
CPC ..... H03K 5/1252; H03K 5/082; H03K 5/2472
USPC .......................................................... 327/43
See application file for complete search history.

(56) References Cited

U.S. PATENT DOCUMENTS

| 5,107,139 | A |  | 4/1992 | Houston et al. |
| 5,929,448 | A | * | 7/1999 | Zimmerman ........... G01T 1/026 |
| | | | | 250/370.07 |
| 6,393,330 | B1 |  | 5/2002 | Giraud et al. |
| 6,665,161 | B1 | * | 12/2003 | Brady ............... H01L 27/14683 |
| | | | | 257/E31.086 |
| 6,794,733 | B1 |  | 9/2004 | Brady et al. |
| 6,969,859 | B2 | * | 11/2005 | Klaasen ..................... G01T 1/17 |
| | | | | 250/370.01 |
| 7,271,608 | B1 |  | 9/2007 | Vermeire et al. |
| 7,880,340 | B2 | * | 2/2011 | Miller ..................... H02H 5/005 |
| | | | | 307/130 |
| 8,575,560 | B1 |  | 11/2013 | Fechner |
| 9,275,747 | B2 | * | 3/2016 | Baumann ................. G11C 8/20 |

(Continued)

OTHER PUBLICATIONS

Barnaby, Total-Ionizing-Dose Effects in Modern CMOS Technologies, IEEE Transactions on Nuclear Science, vol. 53, No. 6, Dec. 2006, pp. 3103-3121.

(Continued)

*Primary Examiner* — Ryan Jager
(74) *Attorney, Agent, or Firm* — Gregory A. Magel

(57) ABSTRACT

Systems and methods for shutting down a functional circuit in response to a predetermined total ionizing dose of radiation employ at least two redundant sensing circuits operated in integrate and measure phases by one or more sequencer-type hardware or software controllers. NMOS TID sensors having leakage currents increasing monotonically with dose may be biased during integrate phases, with bias voltages or duty cycles adjusted to achieve a calibrated responsivity. TID measurements are compared to a corresponding reference, latched to generate overexpose signals, and tested for agreement. Disagreement triggers remeasurement to prevent erroneous shutdown until a minimum number of overexpose signals agree that TID exceeds the predetermined threshold. A disable circuit accepts the redundant overexpose signals and generates a signal to disable a functional circuit. Redundancy and remeasurement protect against unwarranted shutdowns due to radiation-induced single-event effects or other circuit transients or failures.

30 Claims, 9 Drawing Sheets

(56) References Cited

U.S. PATENT DOCUMENTS

| | | | |
|---|---|---|---|
| 10,705,552 B1 | 7/2020 | Zanchi et al. | |
| 2004/0227093 A1* | 11/2004 | Klassen | G01T 1/17 250/370.01 |
| 2024/0105721 A1* | 3/2024 | Donnelly | H01L 21/823425 |

OTHER PUBLICATIONS

Schwank et al., Radiation Effects in MOS Oxides, IEEE Transactions on Nuclear Science, vol. 55, No. 4, Aug. 2008, pp. 1833-1853.
Dawes et al., An IC Compatible Ionizing Radiation Detector, IEEE Transactions on Nuclear Science, vol. NS-28, No. 6, Dec. 1981, pp. 4152-4155.
Shaneyfelt et al., Challenges in Hardening Technologies Using Shallow-Trench Isolation, IEEE Transactions on Nuclear Science, vol. 45, No. 6, Dec. 1998, pp. 2584-2592.
Lipovetzky et al., Field Oxide n-channel MOS Dosimeters Fabricated in CMOS Processes, IEEE Transactions on Nuclear Science, vol. 60, No. 6, Dec. 2013, pp. 4683-4691.

* cited by examiner

TOTAL IONIZING DOSE SHUTDOWN SYSTEM AND METHOD

BACKGROUND OF THE INVENTION

1. Field of the Invention

The present invention relates generally to integrated circuits, and, more particularly, to integrated circuit operation in the presence of ionizing radiation.

2. Description of the Related Art

Integrated circuits (ICs) incorporating Metal-Oxide-Semiconductor (MOS) transistor devices are known to be susceptible to exposure to ionizing radiation. Transient single-event effects can be mitigated using circuit and system redundancy techniques, but cumulative effects of exposure over time (dose) can lead to device degradation and failure, reducing system lifetime. Absorbed dose (energy per unit mass) from exposure to ionizing radiation is quantified using a metric called Total Ionizing Dose (TID). A semiconductor device is termed "radiation hard" (rad-hard) if it can continue to function within specifications during exposure to radiation and after receiving a specified TID. Rad-hard ICs are used in high-energy physics experiments, and in a variety of aerospace/satellite, medical, nuclear power, and military systems. U.S. Department of Defense export regulations (International Traffic in Arms Regulations or ITAR) place specific restrictions on the sales of semiconductor devices having a specified level of radiation hardness, in order to prevent exporting devices that might have utility in space-borne or military systems. One of the ITAR criteria allowing export requires a functional circuit to fail at threshold total dose levels of 500 krad(Si) or higher.

In some cases, rad-hard performance can be achieved using special IC fabrication processes. But increasingly, "Radiation-Hardened-By-Design" (RHBD) IC design and layout techniques are making it possible to use processes offered by commercial foundries to produce rad-hard ICs that can be used in space or satellite applications. Also, modern CMOS semiconductor processes having smaller feature sizes tend to produce circuits that are inherently more tolerant to radiation than earlier generations. As a result, ICs produced for commercial applications can increasingly have problems conforming to ITAR requirements for foreign sale. Sales of circuits designed for satellite applications that may also have other terrestrial commercial applications can also be restricted. ITAR restrictions thus limit the market for chips having legitimate non-military uses, thus having financial consequences for a commercial CMOS or NMOS IC manufacturer.

It would thus be desirable to provide a way to make commercially-useful ICs ITAR-compliant in order to allow them to be freely sold and exported for legitimate non-military uses. Conversely, intentionally radiation-hardened IC designs could be sold for commercial uses if they could be deactivated at a known dose level below the ITAR threshold. A system and method that senses TID and reliably shuts down (disables or renders nonfunctional in some way) a functional circuit upon receiving a dose above a known threshold level would afford a solution for both situations. Such a system or method would preferably be robust against transient events stimulated by radiation or other phenomena, in order to operate reliably under allowed conditions, while protecting against unwarranted shutdowns. In implementing a shutdown function ITAR compliance, it is more important to prevent unwanted shutdowns than it is to guarantee shutdown at the earliest opportunity.

SUMMARY OF THE INVENTION

Accordingly, systems and methods are provided for shutting down a functional circuit in response to a predetermined total ionizing dose (TID) of radiation. These systems and methods employ at least two redundant sensing circuits operated in an integrate phase, in which dose is accumulated in a TID sensor to which a bias voltage is applied in order to achieve a known responsivity to ionizing dose, and a measure phase during which the TID sensor generates a TID signal that is compared to a corresponding reference signal, the output of the comparator latched to produce a latched overexpose signal. Latched overexpose signals from the redundant sensing circuits are either tested for disagreement, in which case remeasurement is initiated, or the latched overexpose signals are reset to inactive, or both, in order to prevent erroneous shutdown. When a minimum number of overexpose signals agree that TID exceeds a predetermined threshold, a disable circuit generates at least one signal that, when active, can be used to disable a functional circuit. Redundancy of sensing circuits and latches, combined with testing for agreement, provide robustness against single-event transients as well as the ability to clear latched faults, thus preventing premature or otherwise unwarranted generation of disable signals. Embodiments using asynchronous hardware controllers running state machines to implement the integrate and measure phases and operate latches in the sensing circuits provide this robustness with low circuit complexity, low noise, and low power consumption.

More specifically, in an embodiment, a total ionizing dose shutdown system is provided that has a plurality of sensing circuits. Each sensing circuit comprises at least one TID sensor that produces a TID signal that changes monotonically with increasing TID, a reference producing a reference signal that corresponds to a dose at a predetermined TID level, a comparator that produces a signal at its output that is active when the TID signal has a value relative to the reference signal that corresponds to a dose exceeding the predetermined TID level, and a latch connected to the comparator output and producing an overexpose signal at the latch output. The shutdown system includes at least one controller that is configured to operate each sensing circuit in an integrate phase and a measure phase, and to provide a signal to each latch commanding the latch output to hold the overexpose signal. A disagreement detector connected to the latch outputs generates a disagree signal that is active when the overexpose signals do not agree, and a disable circuit connected to the latch outputs is configured to generate at least one disable signal that is active when a minimum number of overexpose signals indicate a dose above the predetermined TID level. In some embodiments, there is a separate disagreement detector associated with each sensing circuit. In some embodiments, the disagree signal is connected to the controller, which initiates a measure phase when the disagree signal is active, and in some embodiments, the disagree signal is connected to the latches and resets the overexpose signals to inactive when the disagree signal is active. In some embodiments, the disable signal is active when a majority of overexpose signals indicate a dose above the predetermined TID level.

In some embodiments, the controller is configured to run a sequencer-type state machine having one or more states in the integrate phase and one or more states in the measure phase. The controller may be a synchronous or asynchronous hardware controller, or it may be a digital processor executing software. In some embodiments, a separate controller operates each sensing circuit. In some embodiments, the controller or controllers may be physically separate from the sensing circuits. In some embodiments, the TID shutdown system includes a functional circuit that is disabled when the disable signal is active. In some embodiments, the number of sensing circuits is equal to two.

The TID sensor in some embodiments generates a TID signal from a leakage current that increases with increasing TID. In some embodiments, the TID sensor may comprise at least one NMOS field-effect transistor, and in some embodiments the TID sensor may comprise an NMOS transistor formed using field oxide as a gate oxide. In some embodiments, a bias voltage is applied to the TID sensor during the measure phase as well as during the integrate phase, and in some embodiments, the bias voltage may be pulse-width modulated. In some embodiments, the reference may be internal to the comparator, and in some embodiments the comparator may be a Schmitt trigger. The comparator may comprise three or more redundant comparators having outputs that may be majority-voted, and in some embodiments, low-pass filters may be incorporated in the comparator to mitigate single-event effect transients.

In another embodiment, an integrated circuit is provided that implements a shutdown system as described above and has a plurality of sensing circuits. Each sensing circuit comprises at least one TID sensor that produces a TID signal that changes monotonically with increasing TID, a reference producing a reference signal that corresponds to a dose at a predetermined TID level, a comparator that produces a signal at its output that is active when the TID signal has a value relative to the reference signal that corresponds to a dose exceeding the predetermined TID level, and a latch connected to the comparator output and producing an overexpose signal at the latch output. The integrated may include at least one controller that is configured to operate each sensing circuit in an integrate phase and a measure phase, and to provide a signal to each latch commanding the latch output to hold the overexpose signal. In some embodiments, the at least one controller may be external to the integrated circuit. A disagreement detector connected to the latch outputs generates a disagree signal that is active when the overexpose signals do not agree, and a disable circuit connected to the latch outputs is configured to generate at least one disable signal that is active when a minimum number of overexpose signals indicate a dose above the predetermined TID level. In some embodiments, the disable circuit may be external to the integrated circuit. In some embodiments, the integrated circuit may further comprise a functional circuit connected to the disable signal that is disabled when the disable signal is active.

In yet another embodiment, a method for disabling a functional circuit in response to receiving a predetermined total ionizing dose of radiation is provided. At least two TID sensing circuits are provided, each comprising a TID sensor producing a TID signal that changes monotonically with increasing dose, and a latch. For each sensing circuit, the sensing circuit is reset to an initial state corresponding to a dose below a predetermined TID level; then with a bias applied to the TID sensor, the dose is integrated in the TID sensor for an integration period. In some embodiments, the integration period is terminated by a trigger signal, and in some embodiments, the integration is terminated by a timer, or by both a trigger signal and the expiration of a timer.

The TID signal is measured in each sensing circuit and compared to a threshold corresponding to the predetermined TID level, and the TID measurement is latched. If the latched TID measurements disagree, the method returns to the step of measuring the TID signal. In some embodiments, if the latched TID measurements disagree, or if the measurements agree, but indicate that TID is less than the predetermined TID level, then the step of integrating the dose is returned to, before continuing on to the step of measuring the TID signal. In some embodiments, the bias is removed from the TID sensor before measuring the TID signal. Once a minimum number of latched TID measurements agree indicating a dose above the predetermined TID level, the functional circuit is shut down. In some embodiments, the functional circuit is shut down if at least two of the latched TID measurements indicate a dose above the predetermined TID level.

Other features and advantages of the present invention will be apparent to those skilled in the art upon reference to the following detailed description taken in conjunction with the accompanying drawings, which are to be understood to be exemplary and explanatory, and are intended to provide further explanation of the invention as claimed.

DETAILED DESCRIPTION OF THE PREFERRED EMBODIMENTS

The following Detailed Description is merely exemplary in nature and is not intended to limit the various embodiments or the application and uses thereof Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation. Among other things, embodiments using either active-low (indicated sometimes herein by appending the suffix "_B" to a signal name to conventionally represent "-bar") or active-high digital signals, and positive or negative logic may be implemented using well-known principles of digital synthesis without departing from the spirit and scope of the invention.

Figure 1:
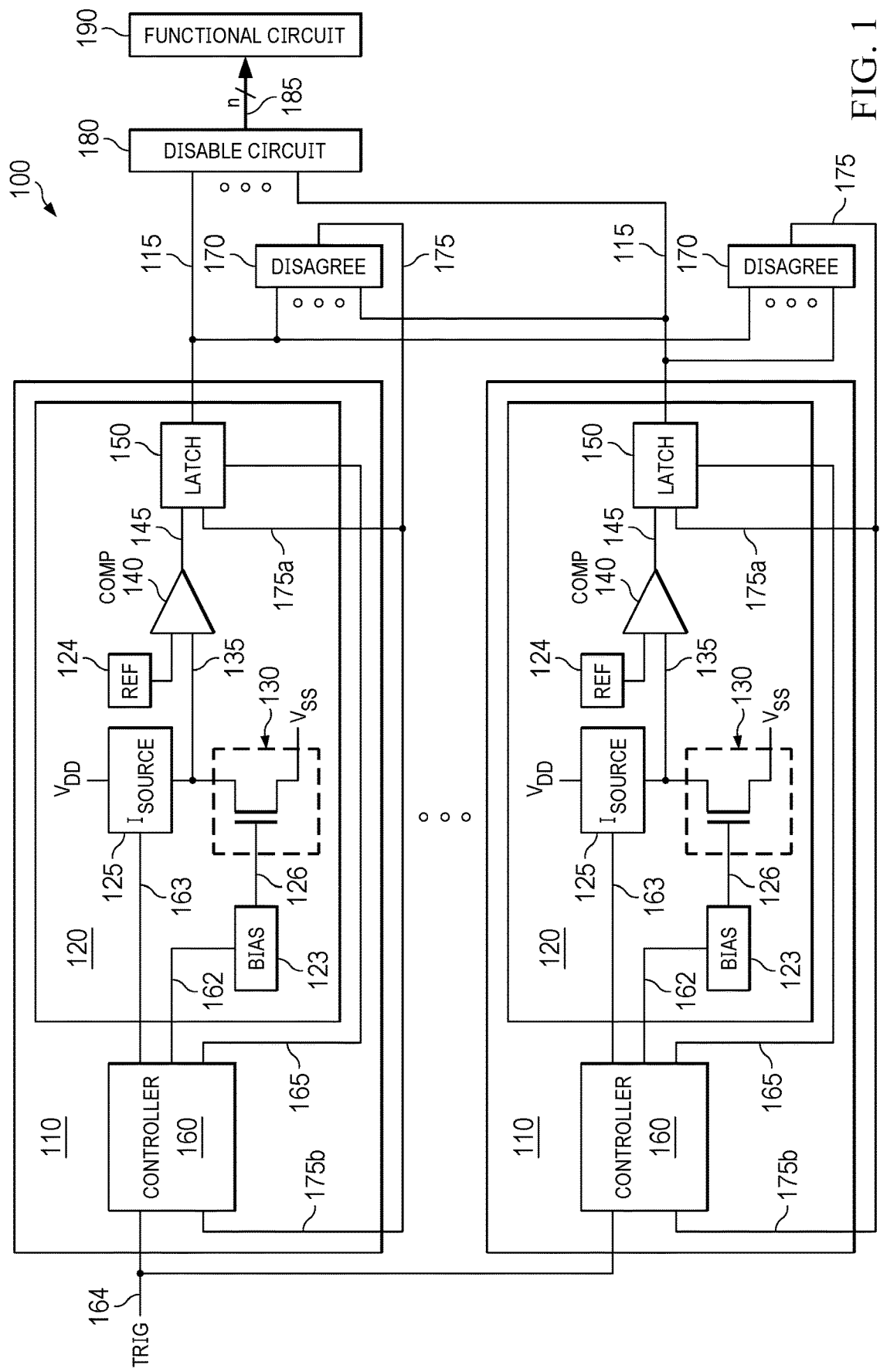
FIG. 1 is schematic block diagram of a total ionizing dose shutdown system according to an embodiment of the invention.

An exemplary embodiment of a shutdown system 100 according to the present invention is illustrated in the schematic block diagram of FIG. 1. Shutdown system 100 may be implemented in one or more integrated circuits. In the embodiment shown in FIG. 1, two or more sensing circuits 110 separately generate overexpose signals 115. That there can be more than two parallel circuit blocks or signals at various places in system 100 is indicated by an open-circle vertical ellipsis at four places in FIG. 1. Redundancy of sensing circuits 110 provides robustness against single-event effects (SEE) such as single-event transients (SET) caused by high-energy particles and single-event upsets (SEU) in latches. Operation of each sensing circuit 110 is governed by a controller 160, which is configured to provide signals to operate latched sensor 120 in integrate and measure phases, which are described below in greater detail. In the illustrated embodiment, there is a controller 160 associated with and operating each sensing circuit 110. In other embodiments, fewer controllers 160 can be used, for example, a single controller 160 could be used to provide signals to operate multiple sensing circuits 110. Controller 160 in some embodiments can be an asynchronous or synchronous digital hardware controller, or in some embodiments it can be implemented in software running on a digital processor. One or more controllers 160 could be physically separated from other portions of shutdown system 100, for example, by being implemented externally in a separate integrated circuit. However, associating a separate controller 160 with each sensing circuit 110 as shown in FIG. 1 provides the advantages of increased redundancy and spatial separation, and therefore robustness against the various types of single-event effects that might affect the controller 160. Simple asynchronous hardware controllers like asynchronous sequencer 1610 and associated circuitry to be illustrated later in FIG. 4A add relatively low additional hardware overhead when replicated for each sensing circuit 110. Each controller 160 accepts trigger signal 164 and signals from one or more disagree circuits 170 that may be used to terminate an integrate phase and thereby initiate a measure or remeasurement phase. Although a single trigger signal 164 is shown connected to more than one controller 160 in FIG. 1, in some embodiments, more than one trigger signal 164 can be applied separately to different controllers 160.

Overexpose signal 115 is set to be active when its respective sensing circuit 110 has received a total ionizing dose exceeding a predetermined threshold dose. Overexpose signals 115 from the sensing circuits 110 are connected to inputs of a disable circuit 180 that generates a disable signal 185 capable of shutting down a functional circuit 190. Functional circuit 190 may be included as part of shutdown system 100, for example, if other shutdown system components are included in the same integrated circuit as functional circuit 190, but it may be a separate (external) device, in which case it is not included as part of system 100. Functional circuit 190 may operate at a different supply voltage than the rest of shutdown system 100. By "shutdown" of the functional circuit 190, it is meant to deactivate, disable, or defeat functional circuit 190 in some way, in order to prevent it from operating and performing its intended function, for example by not meeting some specification item on its data sheet, when TID has exceeded the threshold value. Disable signal 185 may be implemented using a single signal line or a group of n signal lines as indicated in FIG. 1. Two or more redundant signal line channels 185 may preferably be generated by disable circuit 180 and used to guard against a single-event effect (SEE) caused by a high-energy particle affecting one of the channels, in which case the inputs of functional circuit 190 may be designed to require an unambiguous active shutdown signal from disable signal 185. Similarly, disable circuit 180 can be configured to require some minimum number of the overexpose signals 115 to be active. Requiring at least two active signals for shutdown can help guard against an erroneous shutdown induced by a SEE. In some embodiments, disable circuit 180 may require unanimity of overexpose signals 115 indicating a dose above the predetermined TID level, such as when there are only two sensing circuits 110; in other embodiments having more than two sensing circuits 110, a majority function may be used with an odd number of sensing circuits 110 to avoid erroneous shutdown, while not requiring unanimity. The greater unanimity that is required, the lower the chances of unwanted erroneous shutdown.

Overexpose signals 115 are generated by a latched sensor block 120 within each sensing circuit 110, schematically illustrated in the block diagram of FIG. 1. TID sensor 130 produces an analog TID signal 135 that changes monotonically with increasing total ionizing dose. TID signal 135 is compared against a signal produced by reference 124 by comparator 140 to produce a digital exposure signal 145. Latch 150, when commanded by controller 160 using latch signal 165, holds exposure signal 145 to produce overexpose signal 115, which is a latched version of exposure signal 145. Although any TID sensor 130 capable of producing an approximately monotonically-increasing or -decreasing signal with TID may be used, sensor 130 is schematically illustrated in FIG. 1 as an NMOS transistor. NMOS transistors are known to exhibit a negative threshold shift with increasing total ionizing dose, caused by parasitic transistors at the edges of the active region, resulting in sub-threshold leakage currents that increase with TID. NMOS TID sensors can be easily integrated with other (e.g. CMOS) integrated circuitry, without requiring any special processes or layers, using appropriate layouts to create devices having sufficient responsivity to TID, which is defined either as the amount of threshold voltage shift per unit dose, or as a magnitude of increase in leakage current as a function of TID. In the preferred embodiments illustrated herein, TID signal 135 is a voltage level at an input of comparator 140 resulting from the balance of current at this high-impedance input node between a fixed current from current source 125 and the leakage current in NMOS sensor 130, which increases with increasing TID, resulting in a TID signal 135 having a lower voltage with increasing TID. This voltage is compared by comparator 140 with a voltage from reference 124, the reference voltage selected to correspond to a dose at a predetermined threshold TID, for example a TID level that is set significantly below the ITAR compliance criterion of 500 krad(Si), such as 200-300 krad(Si). Whether the logic signal from the comparator output (i.e., exposure signal 145) is arranged to be active high or active low, exposure signal 145 and subsequently its latched version, overexpose signal 115 are considered to be active when TID signal 135 corresponds to a total dose higher than the threshold TID level. Comparator 140 may be a logic gate in some embodiments, and in some embodiments may be a Schmitt trigger. Thus, a threshold voltage may be a characteristic built into comparator 140, so that reference 124 might in some embodiments be considered inherent to comparator 140, without requiring additional circuitry. Alternatively, comparator 140 may be a current comparator that compares a current TID signal 135 to a reference current that corresponds to a dose at the predetermined threshold TID level. The function of comparator 140 may in some embodiments be performed in software in a digital processor in conjunction with an analog-to-digital converter (ADC) that encodes TID signal 135 into digital form.

It is desirable to make TID sensor 130 sensitive enough to generate a useful TID signal 135 at a dose level significantly below the ITAR threshold of 500 krad(Si) so that a disable signal 185 may be reliably used for shutdown below the ITAR threshold. There is more than one technique that can be used to implement sufficiently sensitive sensors. Specially-designed NMOS sensors may be employed, and multiple TID sensors may be connected in parallel to generate more leakage current. For the case of an NMOS sensor, TID sensor 130 may be made more sensitive, i.e., its responsivity can be increased, by applying a bias signal 126 to the NMOS transistor gate that is positive with respect to the NMOS transistor source terminal ($V_{SS}$ as shown in FIG. 1). Such a positive gate voltage increases the build-up of positive charges in parasitic transistors associated with the field oxide, causing a greater negative threshold shift as a function of TID. This bias voltage 126 is applied by bias circuit 123, which is controlled by INTEGRATE signal 162 generated by controller 160. When INTEGRATE signal 162 is active, a positive bias signal 126 is applied to TID sensor 130, which is said to be operating in an integrate phase. However, during an integrate phase, an NMOS TID sensor may be turned on by the positive bias signal 126, such that the sensor transistor current would be much greater than the leakage current at zero bias (subthreshold leakage current) that responds to TID if sensor 130 is connected to $V_{DD}$ through current source 125. Thus, to get a sensitive and repeatable measurement of subthreshold leakage current of an NMOS TID sensor, a separate measure phase may be employed, in which bias signal 126 is set to zero by setting the INTEGRATE signal 162 to inactive, thereby turning off bias circuit 123. During the measure phase, current source 125 is turned on by an active MEASURE signal 163, which may also be generated by controller 160. MEASURE signal 163 is preferably inactive when INTEGRATE signal 162 is active. Thus, INTEGRATE 162 and MEASURE 163 may be logical complements of each other. In other embodiments using different types of TID sensor 130, such as an NMOS transistor having a high threshold voltage (which may be fabricated, e.g., using thicker field oxide instead of gate oxide), bias signal 126 may be left on during measurement, so that INTEGRATE 162 and MEASURE 163 need not be complements of each other. In this case, it may still be desirable to have MEASURE signal 163 turn on current source 125 only during a measure phase, and to initiate a measure phase at a low duty cycle (e.g., relatively infrequently) in order to reduce power consumption and digital noise. A measure phase may be triggered by trigger signal 164, which may be generated either externally or internally to shutdown system 100, in response to an event, such as activation of functional circuit 190, power-up, or a request from an external processor; or at the expiration of a time interval, using a timer.

Figure 4A:
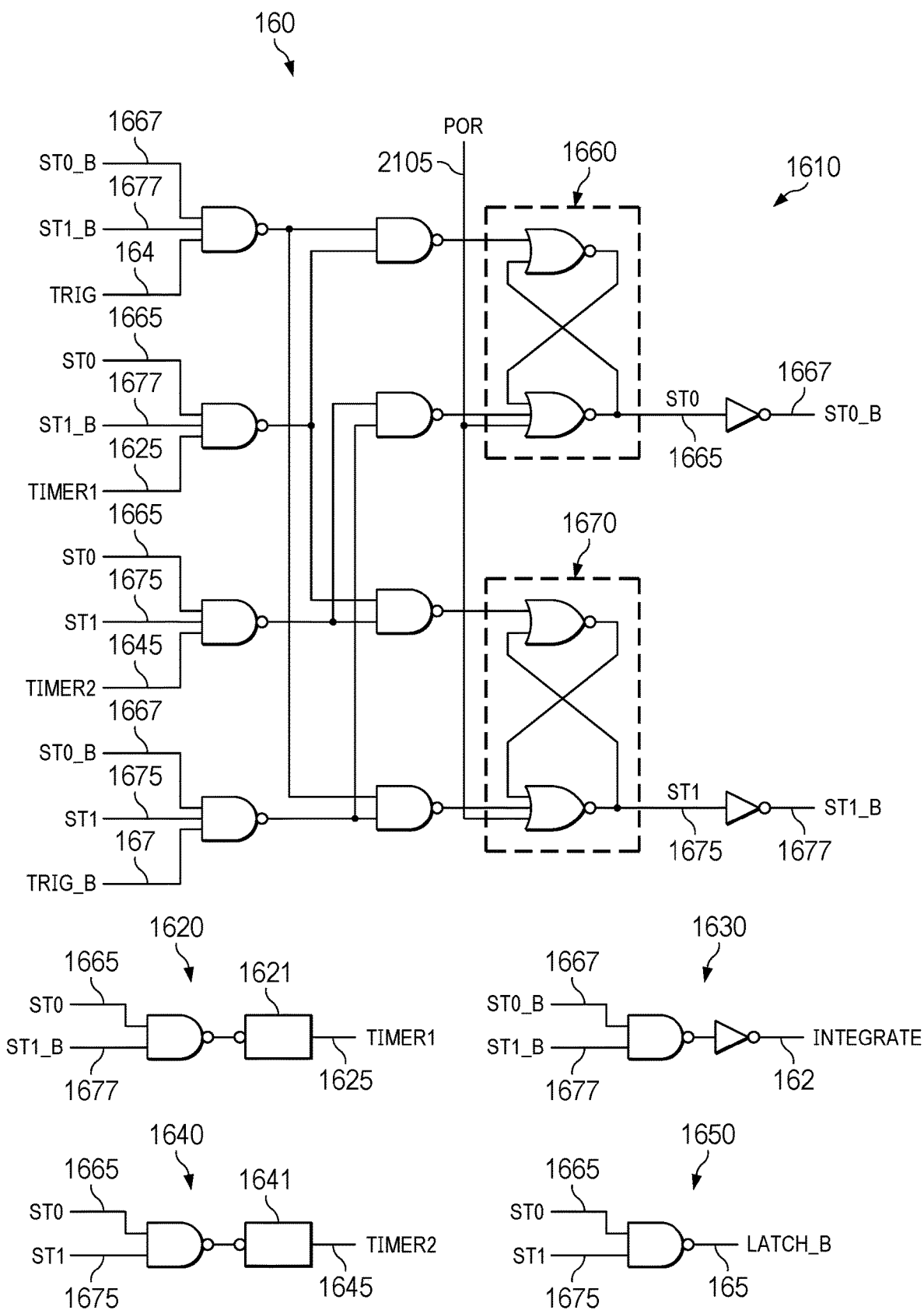
FIG. 4A is a schematic logic diagram of an asynchronous controller implementing the 4-state sequencer of FIG. 2.
Figure 4B:
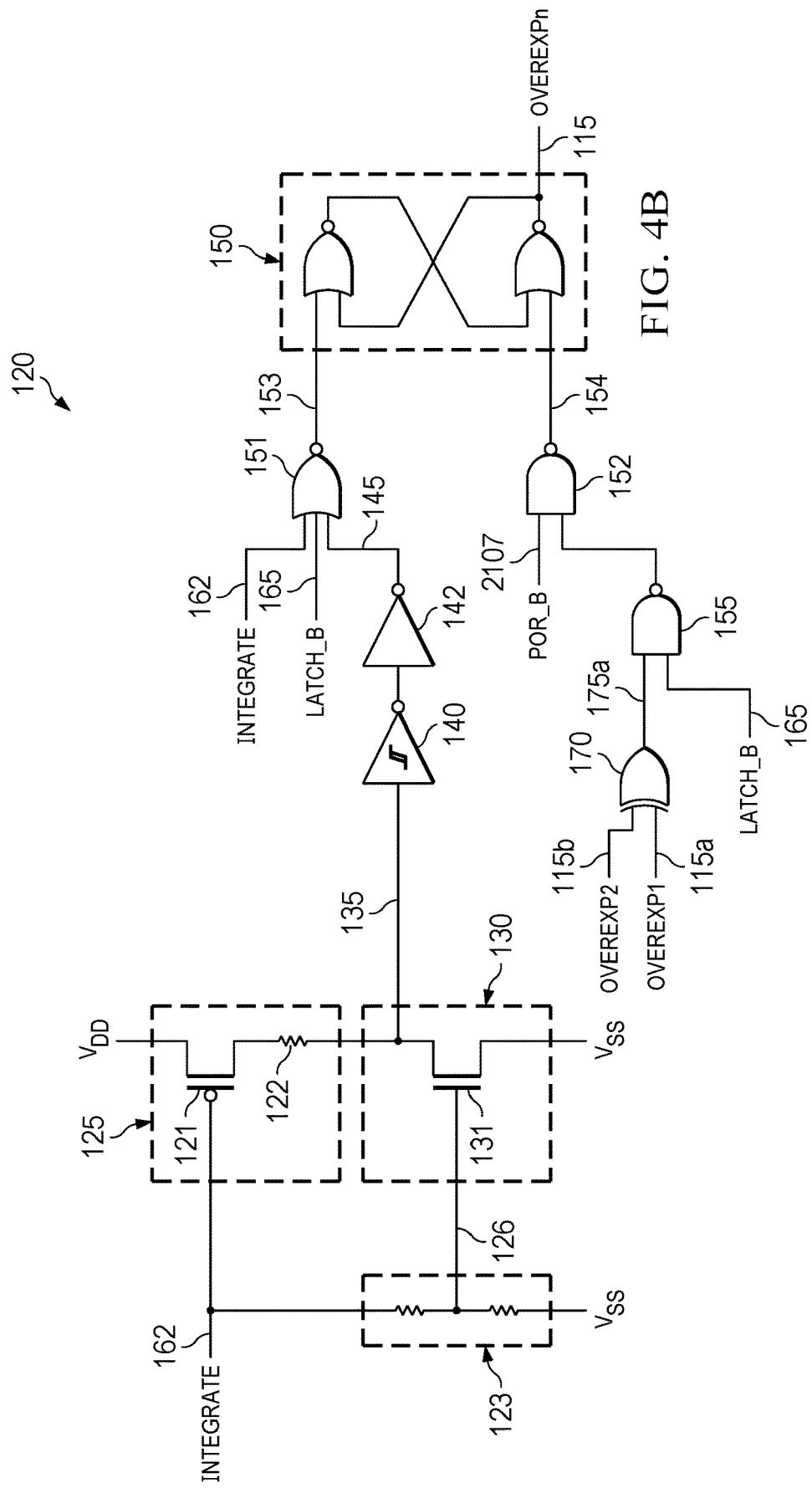
FIG. 4B is a schematic circuit diagram of a latched sensor according to an embodiment of the invention.

The inputs of one or more disagreement detectors 170 are connected to overexpose signals 115. Disagreement detector 170 generates a disagree signal 175 at its output that is active when overexpose signals 115 do not agree with each other. Disagree signal 175 may be used, as will described shortly, to enable shutdown system 100 to recover from radiation-induced SEE or other temporary faults. A single disagreement detector 170 may be used in shutdown system 100 to provide a disagree signal 175 to all sensing circuits 110 (or controller 160), but for the same reasons of spatial separation and redundancy as discussed above with reference to redundant controllers 160, it is preferable to associate a separate disagreement detector 170 with each sensing circuit 110. For a case in which shutdown system 100 comprises only two sensing circuits 110, each disagreement detector 170 may be implemented by a single two-input XOR gate as seen in FIG. 4B, so that redundancy of disagreement detectors 170 adds very little circuit overhead.

Disagree signal 175 may be connected to each latch 150 and when active, used to reset each latch 150 to output an inactive overexpose signal 115; or disagree signal 175 may be connected to an input of each controller 160, in which case an active disagree signal 175 is used to initiate a measure phase (i.e., a remeasurement of TID) in a sensor circuit 110; or it may be used for both purposes. These possible functions for disagree signal 175 are indicated in FIG. 1 by a connection 175a to an input of each latch 150, and by a connection 175b to an input of each controller 160. Connection 175a will be referred to as latch reset signal 175a, and connection 175b as disagree notify signal 175b. Although both signal connections may be implemented in some embodiments, depending on the details of circuit architecture and the operation of latched sensor 120 and latch 150, one or the other signal may be sufficient for correct operation of shutdown system 100. For example, if a remeasurement initiated by disagree notify signal 175b inherently causes a new correct measurement to overwrite the state of latch 150, a separate latch reset signal 175a may be unnecessary. Similarly, for some types of latch 150, latch reset signal 175a may be sufficient to set overexpose signal 115 into a correct state, e.g., to recover from a single-event upset without explicitly requiring a separate disagree notify signal 175b to stimulate a change in state of controller 160.

Figure 2:
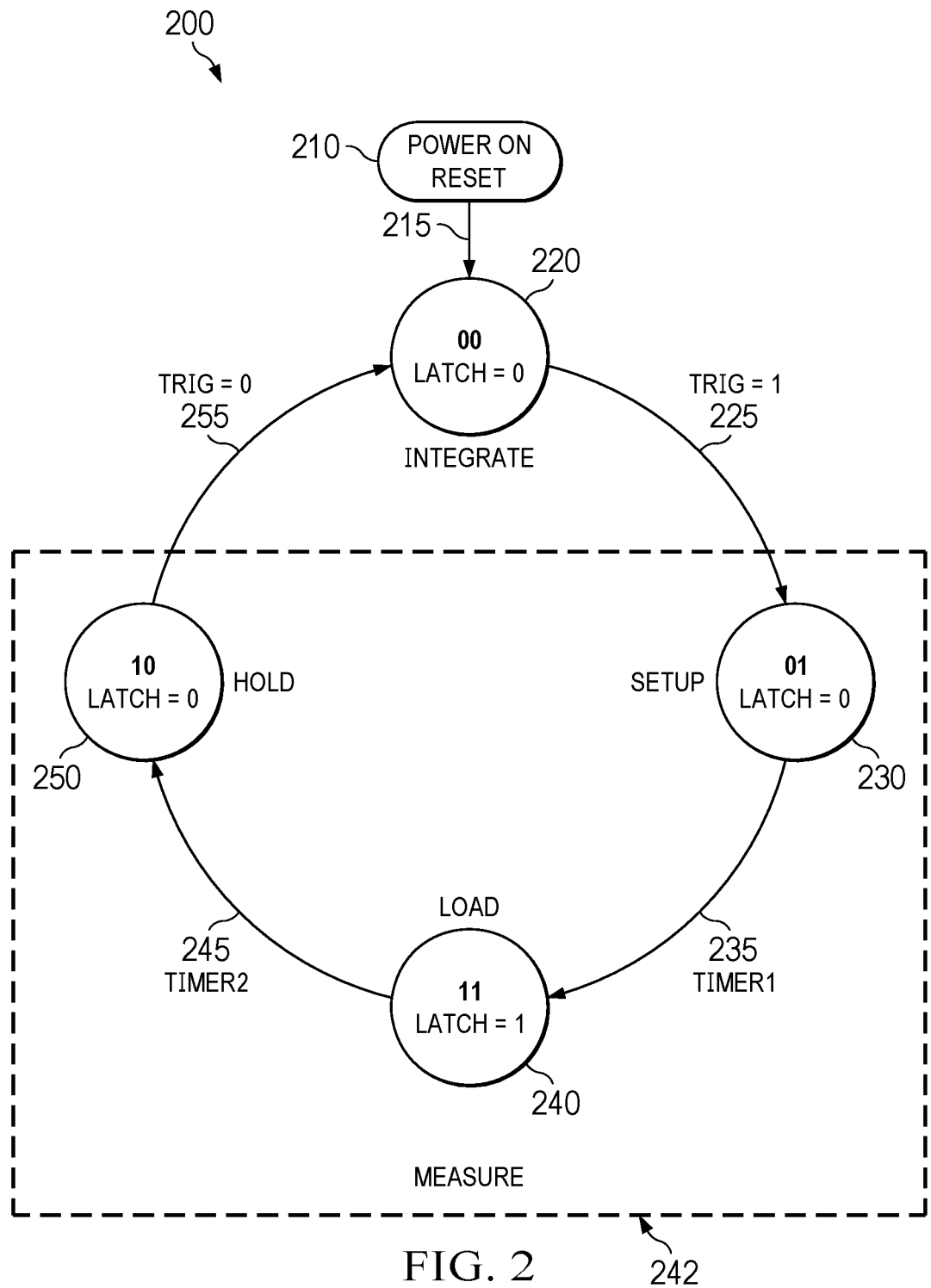
FIG. 2 is a state diagram of a 4-state sequencer for controlling a latched sensor according to an embodiment of the invention.

Now referring to FIG. 2, a state diagram is shown of a four-state sequencer-type state machine 200 that in an embodiment of the present invention may be executed in controller 160 to operate latched sensor 120 in integrate and measure phases. A state machine 200 is executed for each latched sensor 120. Separate integrate and measure phases are useful for TID sensors 130 that employ a bias signal 126 to increase their responsivity during an integrate phase, and for which bias signal 126 is preferably turned off while taking a measurement. A sequencer is a state machine that cycles through a sequence of states in a predefined order. While state machine 200 could be implemented in a processor running software, or by clocked synchronous circuit hardware, an embodiment using asynchronous hardware will be described later in reference to FIG. 4A that can perform the function of controller 160 with a small amount of circuitry while requiring no clock. Using an asynchronous hardware controller to implement the sequencer has advantages with respect to circuit simplicity, low power consumption, and low digital noise since it does not require a digital clock. An n-state machine, where $n=2^k$, can be implemented using k flip-flops. Thus, only two flip-flops (with accompanying state decoding circuitry and timers) are needed to implement the 4-state machine of FIG. 2. Because of the small amount of circuitry needed, a separate controller 160 for each sensing circuit 110 is easily provided. There is no particular requirement for separate sensing circuits 110 to always be in the same state in the sequence, i.e., to run in synchrony with regard to integrate and measure phases, so controllers 160 can run independently without attempting to keep them set to the same state at the same time.

For maximum sensitivity, it is desirable to spend more time in an integrate phase than in a measure phase. From a reset state 210, such as upon power-up of an integrated circuit including shutdown system 100, a startup state transition 215 places state machine 200 into integrate state 220, which in this simple four-state sequencer comprises the entire integrate phase. The four states 220, 230, 240, and 250 are also labeled by the binary numbers 00, 01, 11, and 10, respectively, which, as will be seen later in reference to FIG. 4A, refer to the output states of flip-flops used to implement the state machine. Each state is also labeled by the state of latch signal 165 commanding latch 150 either to load or hold its inputs, i.e., LATCH=1 allows signals at the latch inputs to appear at its outputs, and LATCH=0 refers to latch signal 165 commanding latch 150 to hold its output state. States 230, 240, and 250 together constitute measure phase 242. State machine 200 remains in integrate state 220 (state 00), setting INTEGRATE signal 162 active in order to apply bias signal 126 to TID sensor 130, until trigger signal 164 becomes active and initiates the 00 to 01 transition 225 (labeled by the condition TRIG=1 that stimulates the transition), thereby initiating measure phase 242 by placing the sequencer 200 into setup state 230. Besides being initiated by a trigger, it may also be desirable to arrange for a measure phase to be executed at least at every power-on reset of a functional circuit 190 controlled by shutdown system 100.

As discussed earlier, some NMOS TID sensors cannot be accurately read (i.e., cannot generate a useful TID signal 135) during an integrate phase, thus requiring a separate measure phase. In some embodiments, expiration of an integrate timer could be required in addition to receiving a trigger event for transition 225 in order to enforce spending a minimum time in integrate state 220. Setup state 230 (state 01) is the first state in measure phase 242, in which bias signal 126 is turned off and current source 125 is turned on to enable a measurement. Expiration of a timer (TIMER1) allows proceeding on the 01 to 11 transition 235 to load state 240 (state 11). TIMER1 duration is set long enough to enable exposure signal 145 to settle at the inputs of latch 150. Then in load state 240 (state 11), latch signal 165 is set to active in order to allow the latch to settle, that is, to allow input signals to flip the latch if needed and to appear at the outputs. While in load state 240, disagree signal 175 (specifically latch reset signal 175a) may be ignored so as to prevent it from interfering with latch operation, in order to enable the exposure signal 145 to influence the latch output state during the measure phase and achieve a valid latched overexpose signal 115. Similarly, trigger signal 164 may be ignored during setup state 230 (state 01) and load state 240 (state 11) to allow a triggered measurement to complete. A latch settling time is enforced by TIMER2, whose expiration allows transition 245 into hold state 250 (state 10), in which the latching of measured TID signal 135 is completed to produce a held overexpose signal 115. In the exemplary embodiment illustrated in FIG. 2, the sequencer pauses in hold state 250 until the trigger is released (TRIG=0), enabling transition 255 back to the integrate phase state 220 (state 00), where it remains until a trigger signal occurs (TRIG=1). Alternative trigger types such as edge triggering could be implemented for state transitions, but the trigger signal action described here is consistent with the exemplary asynchronous hardware controller described in reference to FIGS. 4A and 4B.

A potential drawback of the 4-state sequencer 200 of FIG. 2 is that in the event that trigger signals either arrive frequently due to external conditions or are too long in duration, sensing circuit 110 can spend insufficient time integrating, resulting in a lower effective responsivity. One solution mentioned above would be to implement an integrate timer whose expiration is required to allow transition 225 to occur and initiate measure phase 242. However, in many applications, such as space applications, shutdown system 100 may preferably remain powered down for long periods of time, perhaps months or years. Very long timers are difficult to implement in an asynchronous system and dissipate power while operating, while digital counter-based timers require a clock that both dissipates power and generates digital noise. Another solution is to incorporate more states in an integrate phase, as in the embodiment illustrated in the state diagram shown in FIG. 3.

Figure 3:
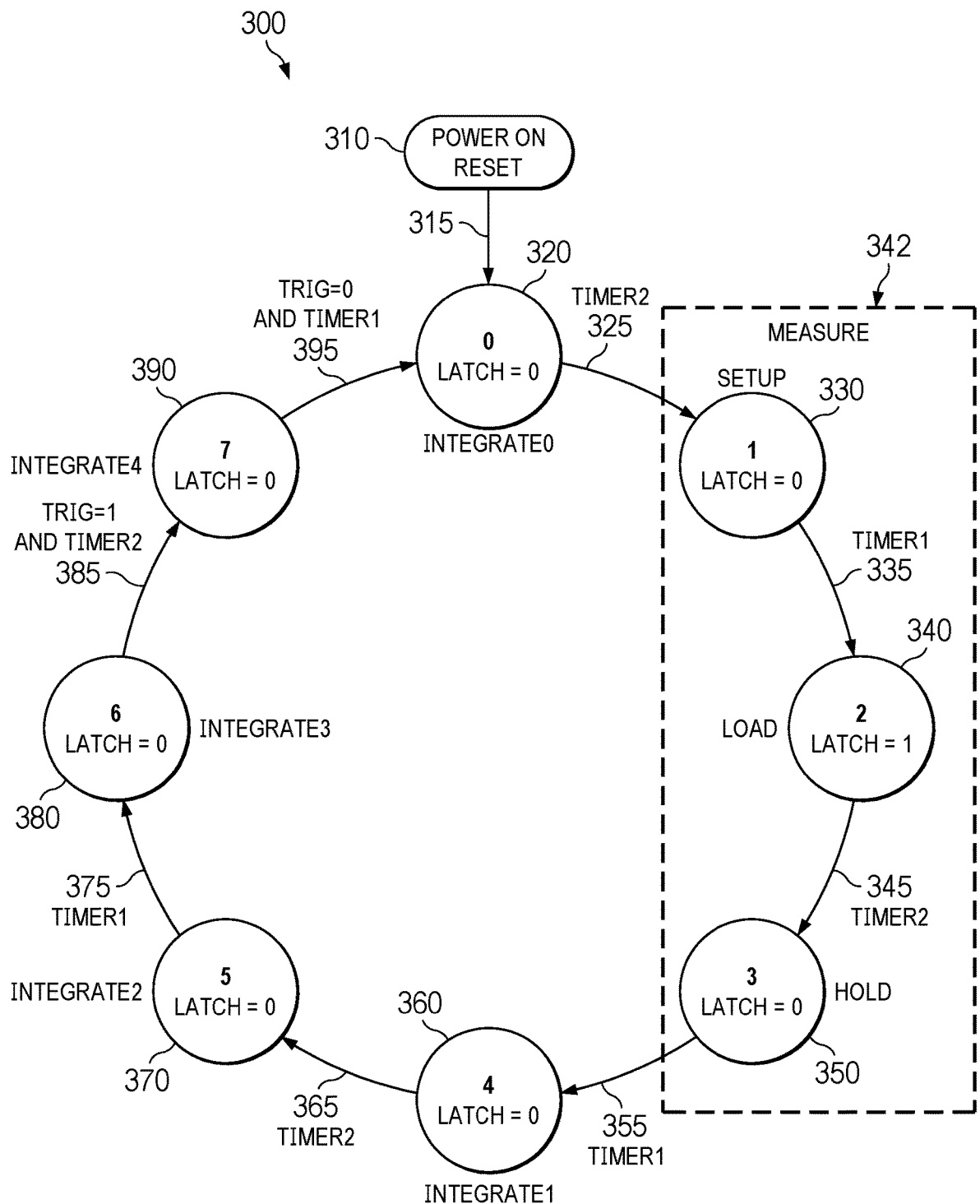
FIG. 3 is a state diagram of an 8-state sequencer for controlling a latched sensor according to another embodiment of the invention.

Referring now to FIG. 3, a state diagram for an eight-state sequencer machine 300 that can be implemented in controller 160 to operate latched sensor 120 is shown. As in 4-state machine 200, 8-state machine 300 has a measure phase 342 comprising three states 330, 340, and 350 (setup states 1, load state 2, and hold state 3, respectively). Instead of a single integrate state in the integrate phase, there are now five integrate states 320, 360, 370, 380, and 390 (states 0, 4, 5, 6, and 7, respectively). Although fewer than four additional integrate states could be used to lengthen the integrate phase, only one more flip-flop is required to synthesize all $8=2^3$ states using an asynchronous state machine. It is preferable to use all 8 states of the sequencer as valid states, so that any single-event upset, although it may change the position in the sequence, will nevertheless place state machine 300 in a valid state. As stated previously in regard to the 4-state machine in FIG. 2, there is no particular requirement for separate sensing circuits 110 to always be in the same state in the sequence, i.e., to run in synchrony with regard to integrate and measure phases. Overexpose signals 115 and disagree signals 175 will still be generated properly, and operate correctly to reset latches and/or reinitiate a sequence. Separate state machines running in redundant controllers 160 will ultimately return to the same integrate state (e.g., state 380=INTEGRATE3) through the expiration of timers, and can await a trigger signal 164 or a power-on reset signal (such as POR 2105 or 2107 in FIGS. 4A and 4B) to resume stepping through the other states.

Operation of 8-state machine 300 proceeds as follows. Power-on reset state 310 initializes the machine, and startup transition 315 places controller 160 into INTEGRATE0 state 320 (state 0). In addition to one or more trigger signals 164 (TRIG) or its inverse 167 (TRIG_B), two timers, arbitrarily named TIMER2 and TIMER1, are used in this exemplary embodiment to stimulate transitions that advance between states. These timers may be shared and reused for different state transitions for economy of circuit complexity. It is preferable to have more than a single timer to accommodate timer setup times for retriggering, i.e., so that one timer can be recovering to prepare for its next initiation while the other is running. In the exemplary embodiment shown here, expiration of TIMER2, which has been started in state 320, brings about transition 325 to setup state 330 (state 1), which initiates a first measure phase 342. When TIMER1 (started in state 330) expires, the sequencer 300 proceeds in transition 335 to load state 340 (state 2), and TIMER2 is restarted. Transition 345 to hold state 350 (state 3) is initiated by the expiration of TIMER2, and TIMER1 is restarted; upon TIMER1 expiration, transition 355 to INTEGRATE1 state 360 (state 4) occurs, and TIMER2 is restarted. Upon TIMER2 expiration, transition 365 causes the machine to advance to state 5, INTEGRATE2 state 370, and TIMER1 is restarted. Expiration of TIMER1 makes machine 300 proceed via transition 375 to INTEGRATE3 state 380 (state 6), where the sequencer waits until there is an active trigger signal TRIG=1 in addition to waiting a minimum time dictated by the duration of TIMER2. Thus state 380 may be considered a "resting" integrate state of the shutdown system 100. When both conditions TRIG=1 and TIMER2 expired are satisfied, transition 385 places the machine into INTEGRATE4 state 390 (state 7), where the sequencer pauses waiting for TIMER1 to expire and for the trigger to return to TRIG=0 in order to progress via transition 395 back to INTEGRATE 0 state 320 (state 0). As discussed above with reference to FIG. 2 and the 4-state machine 200, this trigger treatment effectively synthesizes an edge trigger response by monitoring a change in a level trigger signal and advancing the system between states, and can make use of unclocked flip-flops as in the asynchronous circuits to be described next. The order of the states in different embodiments may be changed somewhat without changing the effective integration time that is realized in a cycle (at least after the first cycle through a sequence). For example, upon power-on reset or other initialization, machine 300 could be placed first in INTEGRATE3 state 380; furthermore, setup, hold, and load states 330, 340, and 350 in measure phase 342 could be placed right after state 380 so that a trigger immediately initiates a measure phase.

Measure phase 342 works the same as measure phase 242 in 4-state machine 200 (FIG. 2): a LATCH command signal output from controller 160 to control latch 150 is inactive (LATCH=0) in all states except load state 340, as shown by the label LATCH=1. While latch reset signal 175a (from disagree signal 175) must be ignored in state 340 while LATCH=1, in any other state, disagree signal 175 may be allowed to reset latch 150 to produce an inactive output overexpose signal 115. In some embodiments, disagree signal 175 (specifically disagree notify signal 175b) can instruct controller 160 to initiate a measure phase 342 by placing sequencer 300 into state 330, with or without sending a latch reset signal 175a to latch 150 to reset overexpose signal 115 to inactive.

State machine sequencers such as 4-state machine 200 and 8-state machine 300 can be implemented in synchronous hardware or in software on a digital controller or processor. But as previously mentioned, asynchronous hardware controllers have advantages with respect to circuit simplicity, low power consumption, and low digital noise since they do not require a digital clock. Referring now to FIG. 4A, a schematic logic diagram is presented for an exemplary asynchronous controller 160 implementing the 4-state sequencer 200 of FIG. 2. Controller 160 consists of subblocks including asynchronous sequencer 1610, which uses two S-R flip-flops 1660 and 1670 to generate the two state bits ST0 1665 and ST1 1675 that together specify the four states in the state machine, TIMER1 generator 1620, integrate decoder 1630 to generate an active-high INTEGRATE 162 signal, TIMER2 generator 1640, and latch signal decoder 1650 to generate latch signal 165, which in this embodiment takes the form of an active-low signal LATCH_B.

Asynchronous sequencer 1610 is synthesized using asynchronous circuit design techniques in which input signals and timer signals, as well as the outputs of flip-flops 1660 and 1670 are decoded by logic gates (in the embodiment of FIG. 4A, all NAND gates) and fed back into the flip-flop inputs to determine states and transitions. In this case, an input trigger signal 164 TRIG and its complement 167 TRIG_B are inputs, which with timer expiration signals TIMER1 1625 and TIMER2 1645 are used to advance between states. Complemented (inverted) versions ST0_B 1667 and ST1_B 1677 of state bits ST0 1665 and ST1 1675, respectively, are also used as inputs to the subblocks 1610, 1620, 1630, 1640, and 1650. TIMER1 1625 is generated from ST0 1665 and ST1_B 1677 as shown in TIMER1 generator subblock 1620 to start timer 1621, whose expiration signal 1625 is the active-high TIMER1 expired signal, which controls transition 235 to advance from setup state 230 (state 01, corresponding to ST1_B=1 and ST0=1) to load state 240 (state 11, corresponding to ST1=1 and ST0=1). In state 11, an active-high TIMER2 expired signal 1645 is generated by TIMER2 generator 1640 by expiration of second timer 1641 that was started by ST0=ST1=1. TIMER2 expiration causes the machine to advance via transition 245 from load state 240 (11) to hold state 250 (10). In state 250 (10), signal TRIG_B 167 going high (TRIG=0) initiates the transition from state 250 (10) to integrate state 220 (00), which in integrate decoder 1630 generates an active-high INTEGRATE signal 162, one of the main outputs of controller 160 used in latched sensor 120 (FIG. 4B). The other output used by latched sensor 120 is active-low latch signal 165 (LATCH_B) generated by latch signal decoder 1650 while the state machine is in hold state 240 (11). The sequence is initiated by a power-on reset (POR) signal 2105 in state 210, which resets both latches 1660 and 1670 such that their respective outputs ST0 1665 and ST1 1675 are both low (zero), thus causing transition 215 into state 220 (state 00).

A simple embodiment of latched sensor 120 is shown in the schematic circuit diagram shown in FIG. 4B. TID sensor 130 is implemented using an NMOS sensing transistor 131 with its source connected to $V_{SS}$. INTEGRATE signal 162 is used both to generate a bias signal 126 applied to the gate of transistor 131, and to operate current source 125, in which signal 162 also performs the function of a complementary MEASURE signal 163. Specifically, a high INTEGRATE signal 162 is voltage-divided in this embodiment of bias circuit 123 to generate an intermediate bias voltage at bias signal 126. When INTEGRATE signal 162 is low, it turns on PMOS transistor 121 in current source 125 to work in conjunction with current limiting resistor 122 to produce a current at TID signal node 135, to which the drain of NMOS TID sensing transistor 131 is also connected. During a measure phase, bias signal 126 at the gate of transistor 131 is low so that this voltage is below threshold and does not turn on sensing transistor 131, so that drain-source current $I_{DS}$ in sensing transistor 131 is mainly attributable to TID-induced leakage current. The difference between the leakage current $I_{DS}$ of transistor 131 and a reference current from current source 125 interacts with the input impedance of comparator 140 to be sensed as a voltage TID signal 135 at the input of comparator 140. Comparator 140 is implemented in this embodiment as a Schmitt trigger inverter having internal thresholds, so that a separate reference circuit 124 is not required. When leakage current in TID sensor 130 is above a threshold, as set by adjusting the reference current by a choice of the value of resistor 122, TID signal 135 voltage is pulled down below a comparator threshold. Thus the output of inverting comparator 140 goes high when TID exceeds a calibrated level corresponding to the reference current. The output of Schmitt trigger comparator 140 is inverted again by inverter 142 to correct the polarity of exposure signal 145 into three-input NOR gate 151 to active low, so that when INTEGRATE 162 is low (during a measure phase) and the LATCH_B latch signal 165 is also low (to allow exposure signal 145 to influence the state of latch 150 during load state 240), signal 153 at the output of NOR gate 151 will go high. Signal 153 is applied to the R input of latch 150, which in this embodiment is implemented as an S-R latch using cross-coupled NOR gates. Thus, a high signal at 153, corresponding to high TID sensor leakage, will set overexpose signal 115 high (active) at the Q-bar output of S-R latch 150 (OVEREXPn=the overexpose signal for this instance of latched sensor 120).

In the lower portion of FIG. 4B, logic circuits are shown for applying a signal 154 to the S input of latch 150 that forces overexpose signal 115 (OVEREXPn) low, i.e., to inactive, to indicate that total ionizing dose as sensed by TID sensor 130 in the illustrated instance of latched sensor 120 has not yet exceeded the calibrated level. The signal name OVEREXPn refers to the fact that the latched sensor 120 illustrated in FIG. 4B may be included in one of n instances of sensing circuits 110, meaning that FIG. 4B is an example schematic that is replicated for each of the n latched sensors 120. For the illustrated embodiment, it is assumed that n=2. Latch 150 may be reset (so that OVEREXPn signal 115 is low) by a power-on reset generating an active-low POR_B signal 2107 through one input of two-input NAND gate 152. The other input of NAND 152 is driven by the output of another NAND gate 155 that uses LATCH_B active-low latch signal 165 to gate latch reset signal 175a. Latch reset signal 175a is generated by disagreement detector 170, here implemented using a simple two-input XOR gate that accommodates two redundant sensing circuits 110. In the illustrated embodiment, as in the embodiment shown in FIG. 1, there is a separate disagreement detector 170 associated with each of the n=2 sensing circuits 110. The inputs to the XOR gate are overexpose signals 115a (OVEREXP1) and 115b (OVEREXP2) from the two instances of sensing circuits 110, with one of signals 115a and 115b corresponding to OVEREXPn 115 at the output of latch 150 in the same instance illustrated in FIG. 4B. If OVEREXP1 overexpose signal 115a and OVEREXP2 overexpose signal 115b disagree, then latch reset signal 175a is high. Latch signal 165 (LATCH_B) at the other input of NAND gate 155 causes latch 150 to ignore disagree signal 175 (in this embodiment, latch reset signal 175a) while LATCH_B=0 (i.e., LATCH=1, which occurs only during load state 240). In the other three states, a disagreement that causes latch reset signal 175a to be set high forces overexpose signal 115 (OVEREXPn) low (inactive) in both instances of latched sensor circuit 120 in response to disagreement being detected.

Figure 5A:
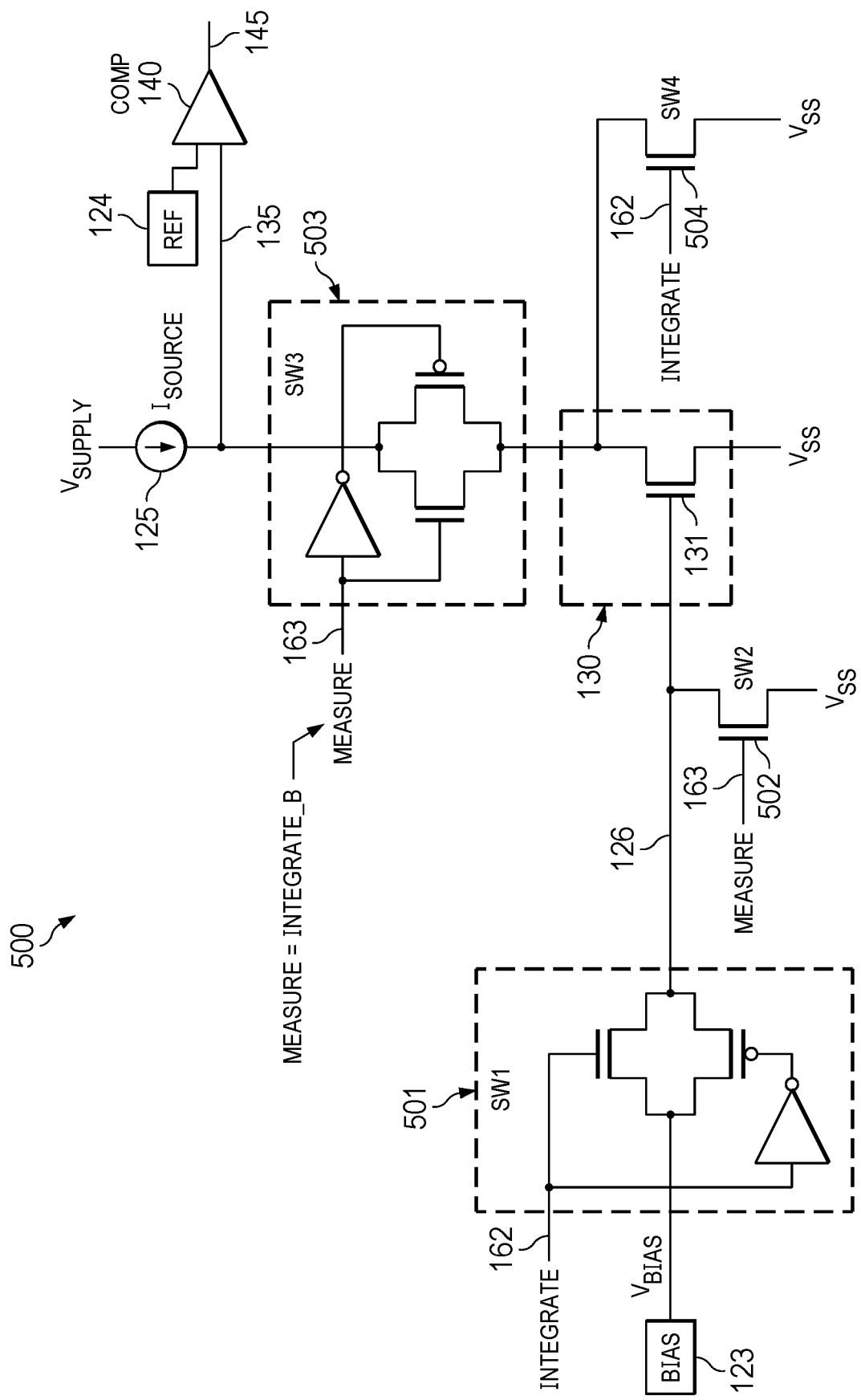
FIG. 5A shows a schematic circuit diagram of a sensor switching circuit for operating an NMOS TID sensor according to an embodiment of the invention.

Now referring to FIG. 5A, a schematic circuit diagram is shown of a sensor switching circuit 500 that can be used to operate a TID sensor 130 in measure and integrate phases. Switches 501 (SW1), 502 (SW2), 503 (SW3), and 504 (SW4) are used to facilitate applying optimal bias conditions during integrate phases and to configure the circuit optimally for measurement in measure phases. Not all switches are necessarily required in every embodiment, as can be seen in FIG. 4B, in which the characteristics of the CMOS circuitry and the INTEGRATE signal 162 are exploited to minimize circuit complexity. Also, various switch technologies may be used in different embodiments. For example, not all TID sensors 130 require bias signal 126 to be set to zero during a measure phase, and switches could be electromechanical instead of the NMOS transistors and CMOS transmission gates illustrated. Here, an NMOS TID sensing transistor 131 is used to illustrate the modes of operation and how the switches may be employed. INTEGRATE 162 and MEASURE 163 signals are inputs provided by controller 160, and are generally complementary, so that MEASURE=INTEGRATE_B (and conversely, INTEGRATE=MEASURE_B); thus a single INTEGRATE or MEASURE signal could be supplied from controller 160, with the other signal derived locally, i.e., within switching circuit 500 using a simple inverter. An integrate phase is signaled by INTEGRATE high and MEASURE low, while a measure phase is signaled by MEASURE high and INTEGRATE low.

During an integrate phase, bias voltage $V_{BIAS}$, greater than $V_{SS}$ and generated in bias circuit 123, is applied to the TID sensor gate as bias signal 126 by turning SW1 501 on. SW1 is implemented as a CMOS transmission gate capable of conducting over the entire voltage range when it is turned on, i.e., when INTEGRATE signal 162 is high. This facilitates the application of low or intermediate bias voltages to TID sensing transistor 131 if required for adjusting responsivity below what would be achieved by applying e.g., $V_{DD}$ as bias signal 126. During an integrate phase, SW2 (NMOS transistor 502) is turned off (MEASURE=low, e.g., set to VSS) so that it does not short the bias voltage to ground. Similarly, SW3 (transmission gate 503) is set to isolate the drain of transistor 131 during an integrate phase. SW4 (NMOS transistor 504) is driven by INTEGRATE 162 to hold the drain of transistor 131 at $V_{SS}$ during an integrate phase, in order to facilitate conditions for positive charge to build up in the isolation oxides that increase leakage current with TID. In some embodiments, SW4 504 may not be required, for example, if the bias voltage applied by bias signal 126 is sufficiently high to turn on transistor 131 such that its drain is already effectively grounded by the sensor itself during the integrate phase.

To measure leakage current, INTEGRATE 162 is set low and MEASURE 163 is set high. During a measure phase, SW1 501 is set to isolate transistor 131 from bias source circuit 123, and the gate of transistor 131 is grounded (connected to $V_{SS}$) by NMOS transistor 502 (SW2). NMOS transistor 504 (SW4) is turned off to disconnect the drain of transistor 131 from $V_{SS}$, and SW3 (transmission gate 503) is turned on to connect sensor 130 to TID signal node 135. Transmission gate 503 has a low voltage drop when on, and may alternatively be connected between current source 125 ($I_{SOURCE}$) and signal node 135. $V_{SUPPLY}$ may be $V_{DD}$ as in FIG. 1, or another voltage convenient for operating current source 125 or otherwise useful for TID measurement. The operation of reference 124 and comparator 140 to generate exposure signal 145 has already been described with reference to other figures.

Figure 5B:
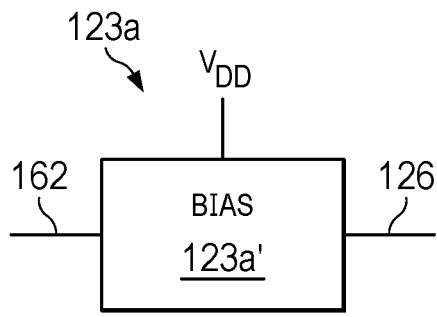
FIGS. 5B-5D are schematic diagrams of alternate embodiments of bias circuits.
Figure 5C:
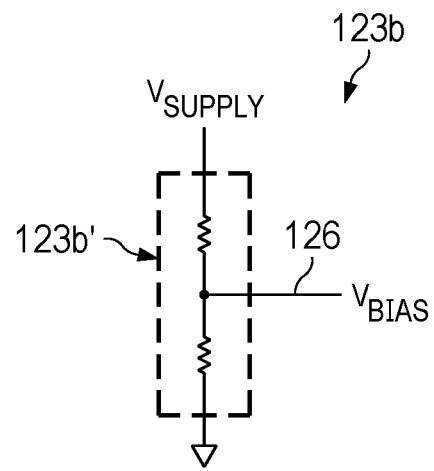

Various alternate embodiments of bias circuits 123 to generate adjustable bias voltages between $V_{SS}$ or ground and $V_{DD}$ to apply to sensor 130 are shown in the schematic diagrams of FIGS. 5B-5C. In the block diagram of FIG. 5B, $V_{DD}$ bias circuit 123a is implemented using a bias control circuit 123a' to control voltage bias signal 126. In various embodiments, INTEGRATE signal 162 can simply switch $V_{DD}$ on and off at signal 126; or a more complex form of signal 162 can adjust the voltage at 126 between $V_{SS}$ and $V_{DD}$, or otherwise vary the bias voltage 126 applied to TID sensor 130. In FIG. 5C, a voltage divider circuit 123b generating a fixed bias voltage 126 between $V_{SUPPLY}$ and ground (or $V_{SS}$) uses a resistive voltage divider 123b' similar to that used in the embodiment shown in FIG. 4B.

Figure 5D:
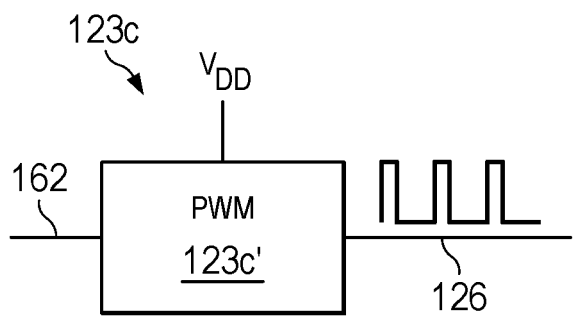

In FIG. 5D, a block diagram is shown of a pulse-width modulation (PWM) bias circuit 123c. Bias signal 126 need not be a dc variable voltage. If a calibrated responsivity is desired for TID sensor 130 that is lower than that obtained from applying a full $V_{DD}$ to the gate during integrate phases, applying $V_{DD}$ (or another voltage) for less than the total available time for integration (e.g., for less than the full integrate time periods in the state machine) will have a similar effect to applying a lower bias voltage in reducing the buildup of charge responsible for TID-induced leakage currents. Different implementations of pulse-width modulation are possible, symbolized in FIG. 5D by pulse-width modulator block 123c' which is capable of switching bias signal 126 between two voltages, such as between ground and a supply voltage exemplified by $V_{DD}$. In some embodiments, PWM bias signal 126 may be gated by INTEGRATE signal 162 controlling pulse-width modulator 123c' so that pulses are only delivered during an integrate phase. Variations of PWM having different time scales may have similar effects on responsivity. A relatively high-frequency PWM having a period significantly shorter than the duration of an integrate state is one possibility. Such periods can be microseconds or milliseconds, depending on timer durations. In some applications, such as space applications, the PWM period might be hours, compared to months or years that it might take to approach a shutdown threshold TID level in krads(Si). For such situations, a PWM transition to the higher voltage could be stimulated by a power-on reset to occasionally check operation, or there might be, for example, an externally-generated periodic (or aperiodic) trigger signal that initiates a high pulse. Separate controllers may be used to switch the PWM bias voltages and to operate the state machine. In some embodiments, a PWM transition can serve as a master clock and be used to trigger state transitions as part of the operation of controller 160. The length of the low parts of the PWM duty cycle can be sufficient to perform a measurement phase, or a rapidly-pulsing PWM output may be forced low during a measurement phase. There is no requirement that voltage biasing of TID sensor 130 be strictly periodic, as long as a predictable approximate duty cycle and responsivity can be achieved, so occasional bias periods initiated by external controllers 160 or a functional circuit 190 may be used instead of a strictly-periodic PWM signal. It can be seen that great flexibility in adjusting responsivity can be achieved using PWM techniques without the requirement for subtle analog bias voltage adjustments.

Figure 6:
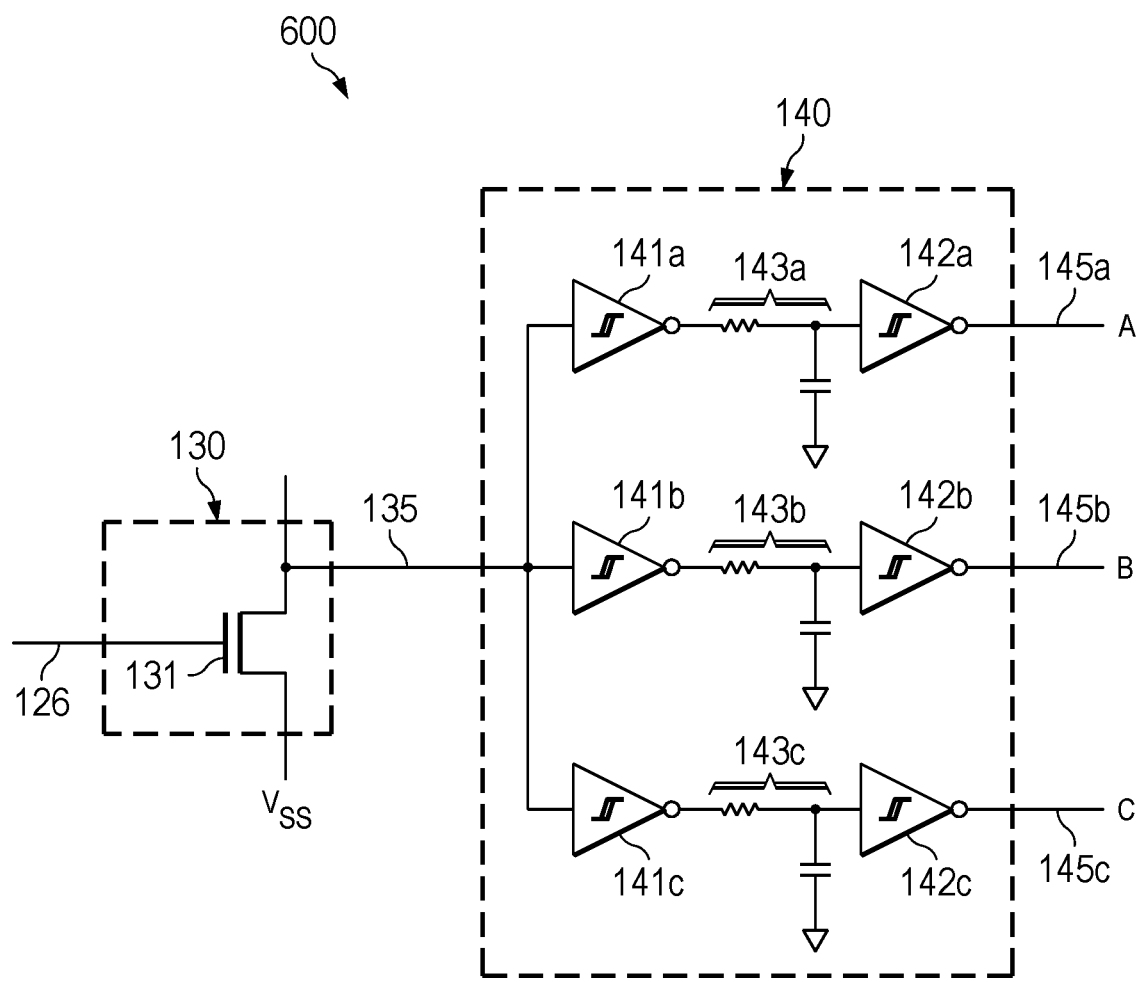
FIG. 6 is a schematic circuit diagram of a triple redundant comparator according to another embodiment of the invention.

A feature of the present invention is robustness against radiation-induced erroneous shutdown provided by various forms of spatial and temporal redundancy to produce a radiation-hardened shutdown circuit 100. Additional redundancy, voting, and transient-mitigation techniques not heretofore shown explicitly in the block diagrams and exemplary circuit embodiments may also be implemented as part of the architecture of sensing and voting circuitry. Now referring to FIG. 6, a schematic diagram is shown of a triple-redundant comparator circuit 600 that includes a redundant comparator unit 140 for mitigating single-event transients (SET) that can be caused by heavy ions striking TID measurement portions of shutdown system 100. The risk is that a SET can occur on an exposure signal 145 that gets latched as an erroneously active overexpose signal 115, and the goal is to prevent false disable signals 185 from being generated. This risk is mitigated by replication of comparators and by providing multiple redundant comparator outputs, e.g., first, second, and third redundant comparator outputs A, B, and C (145a, 145b, and 145c, respectively) that can be passed to a majority voter preceding latch 150, or to multiple latches 150 whose outputs are voted, so that a SET in one branch is unlikely to affect the latched overexpose signal 115. In the illustrated embodiment, three Schmitt trigger comparators 141a, 141b, and 141c (first, second, and third Schmitt triggers, respectively) are driven by TID signal 135, here generated in TID sensor 130 symbolized by NMOS sensing transistor 131 driven by bias signal 126. A SET in one of the Schmitt trigger comparator inputs affects only that branch.

Single-event transients are very rapid (on the order of picoseconds in duration), and thus the inclusion of first, second, and third RC low-pass filters 143a, 143b, and 143c having time constants significantly longer than the duration of a transient, e.g., on the order of nanoseconds, can greatly reduce the amplitude of a transient at the input of the following stages and help ignore instantaneous changes in TID signal 135 while allowing persistent signal changes to pass. In this embodiment, first, second, and third additional Schmitt trigger inverters 142a, 142b, and 142c are incorporated to perform inversion to active-low outputs analogous to inverter 142 in FIG. 4B, and also to buffer the outputs of low-pass filters 143a, 143b, and 143c. In alternative embodiments (not shown), a single RC filter can be connected directly to TID signal 135, with the filter output then driving redundant comparators 141a, 141b, and 141c, whose outputs are optionally inverted and connected as just described either to separate latches or to inputs of a majority voter. Voting can be performed either digitally or in the analog domain.

Shutdown system 100 can be implemented in some embodiments in an integrated circuit (not shown), as mentioned previously. There are several variations of an integrated circuit that might be useful. Shutdown system 100 could be incorporated into a standalone packaged integrated circuit, or as an integrated circuit die for hybrid integration with other circuits. All of FIG. 1 could be implemented in an integrated circuit, in which an integrated circuit containing functional circuit 190 could also include a shutdown system 100 as described so that the entire functional integrated circuit can meet ITAR export restrictions. Alternatively, a shutdown integrated circuit, containing all of FIG. 1 except for functional circuit 190, could be provided that has a disable output signal or signals 185 to be used for controlling an external functional circuit 190, which might be in a separate integrated circuit. In some embodiments, as also discussed, a controller or controllers 160 might be external, i.e., not integrated onto the same substrate as the rest of shutdown system 100; for example, when a master controller in an associated system can, among other things, (perhaps in software) execute the state machines needed to drive shutdown system 100 in integrate and measure phases. In other embodiments, disable circuit 180 may not be included in the same integrated circuit as the rest of shutdown system 100, but might be integrated with functional circuit 190. For example, functional circuit 190 could be in a separate integrated circuit that has multiple inputs for disable signals, and the voting or unanimity functions performed in disable circuit 180 could be performed within the same integrated circuit as functional circuit 190, instead of being integrated with the sensing circuits 110.

Figure 7:
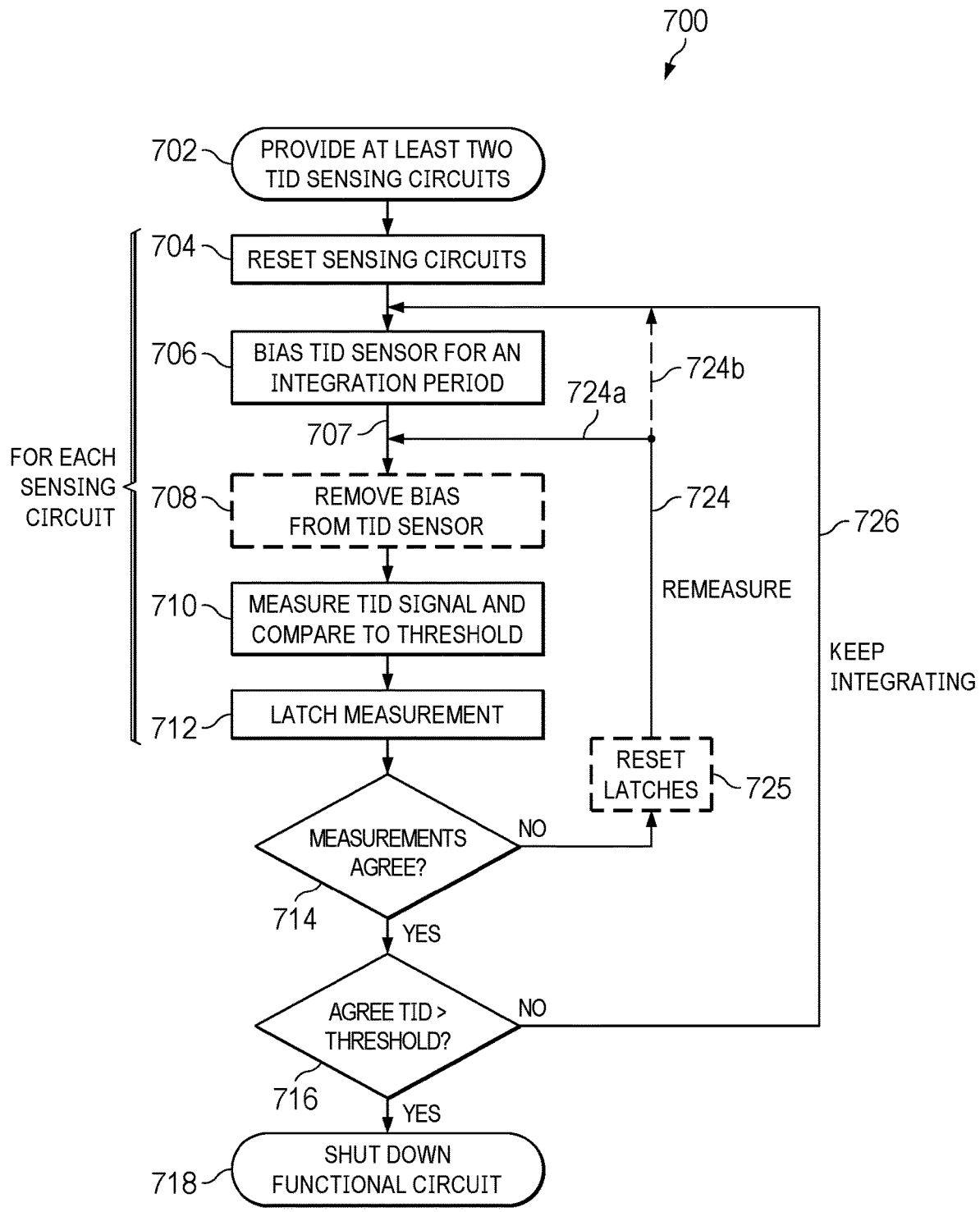
FIG. 7 is a flow chart of a method for total ionizing dose shutdown.

Now referring to FIG. 7, a flow chart is given for a method 700 for total ionizing dose shutdown of a functional circuit. Alternative optional steps or paths are indicated by dashed lines. At least two TID sensing circuits are provided at the beginning step 702. These sensing circuits may have all or most of the functions of sensing circuits 110 in shutdown system 100. The sensing circuits are reset in step 704, for example, as the result of a power-on reset or an externally-generated reset signal, to an initial state corresponding to a dose below a predetermined TID level, which may be, for example, a threshold level sufficient to cause a shutdown to occur reliably at a dose below the 500 krad(Si) ITAR criterion. This step 704 is performed for each sensing circuit in the shutdown system. The initial state (corresponding to states 210 and 310 in FIGS. 2 and 3, respectively) resets all latches to indicate no overexposure, i.e., that no TID signals indicate a dose above the threshold level, and initializes state machines into a valid state. In the embodiment shown here, the system is reset into a state in an integrate phase. In alternative embodiments (not shown), a first measure phase can be entered to measure and test TID signals before starting a first integration period.

Once in an integrate state (the integrate phase), in step 706, the dose is integrated by each TID sensor. A bias is applied to the sensor, if required to enhance its responsivity, for an integration period that may be terminated, as indicated by transition path 707, either by expiration of a timer, or by a trigger signal that commands the start of a measure phase, or by a condition requiring both. As discussed earlier with regard to trigger signal 164, such a transition 707 may be triggered by trigger signal 164, which may be generated either externally or internally to shutdown system 100, in response to an event, such as activation of functional circuit 190, power-up, or a request from an external processor; or at the expiration of a time interval, using a timer. Upon termination of the integration period, method 700 enters a measure phase via transition 707. A measure phase comprises a first optional step 708 of removing the bias from the TID sensor, roughly corresponding to a setup state such as 230 or 330 in the state machines illustrated in FIGS. 2 and 3. Then in step 710, the TID signal is measured, e.g., by measuring a leakage current in an NMOS transistor, and the TID signal is compared to a threshold that corresponds to the predetermined TID level (TID threshold). This step is related to the load step 240 or 340 in the state machines allowing the TID measurement to influence the output signals of the latches. The measure phase ends with latching the TID measurement in step 712, corresponding to a hold state 250 or 350 in FIGS. 2 and 3. These integration and measurement steps 706 through 712 are performed separately in each sensing circuit; but, as discussed earlier for the shutdown system and state machines, it is not necessary for the integration and measurement steps to be performed simultaneously at each step for each sensing circuit; the sensing circuits need not be synchronized so that they are all performing the same step in the method at the same time.

In step 714, the measurements from all of the sensing circuits are tested for agreement, and if a sufficient level of agreement is not found, then path 724 (remeasure) returning the method to a measure phase is taken. In some embodiments, unanimity might be required to constitute a sufficient level of agreement to proceed to step 716. Otherwise, path 724 is taken, and optional step 725 of resetting the latches may be performed if necessary due to the type of latches employed, or as a consequence of timing and circuit details necessitating remeasurement starting from a state corresponding to a dose under the TID threshold. Path 724 can be implemented in at least two alternative ways: either path 724a (back to path 707 proceeding to a measure phase) can be taken to initiate a remeasurement immediately without further integration, or taking path 724b (back to step 706) allows another integration period to occur before starting another measurement.

In step 716, agreement that measured TID is above the predetermined TID level is checked. If the measurements from sensing circuits agree, but agree that TID has not yet reached the TID threshold, then path 726 is taken to keep integrating and go through an integrate and measure cycle again. However, if a minimum number of measurements agree indicating a dose above the predetermined TID level, i.e., that the TID threshold has been exceeded, then the method proceeds to step 718 in which the functional circuit is disabled (shut down). Unanimity may not be required to initiate shutdown, but preferably at least two sensing circuits are required to agree in order to guard against single-event effects. In some embodiments, a majority of sensing circuits agreeing on shutdown might be required, or perhaps a supermajority, if not unanimity. A variety of methods may be used to realize a shutdown, some of which have been listed in conjunction with the description of FIG. 1, but, in any case, shutdown implies that the functional circuit is rendered incapable of performing its intended function and meeting its guaranteed specifications.

While the present invention has been particularly shown and described in detail in the foregoing specification with reference to preferred embodiments thereof, it will be evident that various modifications and changes may be made thereto without departing from the broader spirit and scope of the invention as set forth in the appended claims. For example, it will be apparent to those skilled in the art that while the present invention has been illustrated using examples from CMOS integrated circuit technology, other IC technologies using different materials and device configurations, or discrete device technologies may be used to implement the inventive principles that are described, and various logic implementations of digital circuits and a variety of analog circuit designs may be employed. Alternative TID sensor devices having a monotonic response to dose other than those specifically mentioned may be used. As mentioned above, alternative embodiments may be implemented using different types of controllers and software implementations of the inventive method, or by using greater or lesser levels of redundancy within various portions of the circuitry. Integrated circuit embodiments of the invention may contain some or all of the functions of inventive system, and some functions, such as a controller or disable circuit, may be implemented separately from an integrated circuit containing the sensing circuits and latches. A functional circuit to be disabled may either be included in the same integrated circuit or be physically separate from the sensor and shutdown portion. Besides integrating an entire system into one package, a number of separate integrated circuits comprising portions of a shutdown system could be employed, in order to spatially separate functions for various reasons, such as to fit geometric system constraints or for enhanced robustness. Additional components and conventional connections not explicitly drawn or described may be used in implementing various embodiments without departing from the scope of the invention. Similarly, integrated circuits according to the present invention may include electrostatic discharge, overvoltage, and/or overcurrent protection circuits among other ancillary circuits at inputs or outputs in some embodiments. The specification and drawings are, accordingly, to be regarded in an illustrative rather than a restrictive sense.

Other applications of these techniques will also be apparent, and therefore the scope of the invention is much broader than the few specific examples described herein. While the present invention has been described in relation to disabling a functional circuit in order to meet export criteria, the systems and methods disclosed herein may also be applied in different ways to a variety of other systems affected by ionizing radiation. For example, instead of disabling a circuit in response to achieving a dose threshold, disable signal 185 could be used to predict a potential malfunction, or to initiate actions to protect sensitive circuitry such as adjusting circuitry to be protected before a higher hazardous dose results in damage. In a different application, an embodiment could be used as part of a personal dosimeter to produce an indication that a predetermined dose level has been exceeded, for example in medical or other radiation safety environments,

We claim:

1. A total ionizing dose (TID) shutdown system comprising:
    a plurality of sensing circuits, each comprising
        at least one TID sensor that produces a TID signal that changes monotonically with increasing total ionizing dose,
        a reference producing a reference signal that corresponds to a dose at a predetermined TID level,
        a comparator having an input connected to the TID signal and an input connected to the reference signal, and producing a signal at a comparator output that is active when the TID signal has a value relative to the reference signal that corresponds to a dose exceeding the predetermined TID level, and
        a latch having an input connected to the comparator output and producing an overexpose signal at a latch output;
    at least one controller configured to operate each sensing circuit in an integrate phase during which a bias voltage is applied to the TID sensor and a measure phase during which the TID sensor generates the TID signal, and to provide a signal to the latch to command the latch output to hold the overexpose signal;
    at least one disagreement detector connected to the latch outputs and configured to generate a disagree signal that is active when the overexpose signals do not agree; and
    a disable circuit connected to the latch outputs and configured to generate at least one disable signal that is active when a minimum number of the overexpose signals agree indicating a dose above the predetermined TID level.

2. The system of claim 1, further comprising a functional circuit connected to the disable signal that is disabled when the disable signal is active.

3. The system of claim 1, wherein the number of sensing circuits is equal to two.

4. The system of claim 1, wherein a separate controller operates each sensing circuit.

5. The system of claim 1, wherein the TID signal is generated from a leakage current that increases with increasing TID.

6. The system of claim 1, wherein the TID sensor comprises at least one NMOS field-effect transistor.

7. The system of claim 6, wherein the TID sensor comprises an NMOS transistor formed using a field oxide as a gate oxide.

8. The system of claim 1, wherein the bias voltage is applied during the measure phase as well as during the integrate phase.

9. The system of claim 1, wherein the bias voltage is pulse-width modulated at a duty cycle of less than 100 percent.

10. The system of claim 1, wherein the reference is internal to the comparator.

11. The system of claim 10, wherein the comparator is a Schmitt trigger.

12. The system of claim 1, wherein the comparator comprises three or more redundant comparators.

13. The system of claim 12, further comprising one or more low-pass filters configured to mitigate single-event effect transients.

14. The system of claim 1, wherein the controller is configured to run a sequencer-type state machine having one or more states in an integrate phase and one or more states in a measure phase.

15. The system of claim 14, wherein the controller is asynchronous.

16. The system of claim 14, wherein the state machine has 4 states including an integrate state in the integrate phase, and setup, load, and hold states in the measure phase.

17. The system of claim 1, wherein there is a separate disagreement detector associated with each sensing circuit.

18. The system of claim 1, wherein the disagree signal is connected to the controller and the controller initiates a measure phase when the disagree signal is active.

19. The system of claim 1, wherein the disagree signal is connected to the latches and resets the overexpose signals to inactive when the disagree signal is active.

20. The system of claim 1, wherein the disable signal is active when a majority of the overexpose signals indicate a dose above the predetermined TID level.

21. The system of claim 1, wherein the disable signal comprises two or more redundant disable signals.

22. An integrated circuit comprising:
    a plurality of sensing circuits, each comprising
        at least one TID sensor that produces a TID signal that changes monotonically with increasing total ionizing dose,
        a reference producing a reference signal that corresponds to a dose at a predetermined TID level,
        a comparator having an input connected to the TID signal and an input connected to the reference signal, and producing a signal at a comparator output that is active when the TID signal has a value relative to the reference signal that corresponds to a dose exceeding the predetermined TID level, and
        a latch having an input connected to the comparator output and producing an overexpose signal at a latch output;
    at least one controller configured to operate each sensing circuit in an integrate phase during which a bias voltage is applied to the TID sensor and a measure phase during which the TID sensor generates the TID signal, and to provide a signal to the latch to command the latch output to hold the overexpose signal;
    at least one disagreement detector connected to the latch outputs and configured to generate a disagree signal that is active when the overexpose signals do not agree; and
    a disable circuit connected to the latch outputs and configured to generate at least one disable signal that is active when a minimum number of the overexpose signals agree indicating a dose above the predetermined TID level, the disable signal connected to a pad usable for connection to external circuitry.

23. An integrated circuit comprising:
    a plurality of sensing circuits, each comprising
        at least one TID sensor that produces a TID signal that changes monotonically with increasing total ionizing dose,
        a reference producing a reference signal that corresponds to a dose at a predetermined TID level,
        a comparator having an input connected to the TID signal and an input connected to the reference signal, and producing a signal at a comparator output that is active when the TID signal has a value relative to the reference signal that corresponds to a dose exceeding the predetermined TID level, and a latch having an input connected to the comparator output and producing an overexpose signal at a latch output;

at least one controller configured to operate each sensing circuit in an integrate phase during which a bias voltage is applied to the TID sensor and a measure phase during which the TID sensor generates the TID signal, and to provide a signal to the latch to command the latch output to hold the overexpose signal;

at least one disagreement detector connected to the latch outputs and configured to generate a disagree signal that is active when the overexpose signals do not agree;

a disable circuit connected to the latch outputs and configured to generate at least one disable signal that is active when a minimum number of the overexpose signals agree indicating a dose above the predetermined TID level; and a functional circuit connected to the disable signal that is disabled when the disable signal is active.

24. A method for disabling a functional circuit in response to receiving a predetermined total ionizing dose (TID) of radiation, comprising the steps of:

providing at least two TID sensing circuits, each comprising a TID sensor generating a TID signal that changes monotonically with increasing dose and a latch;

for each sensing circuit:
resetting the sensing circuit to an initial state corresponding to a dose below a predetermined TID level,
integrating the dose with a bias applied to the TID sensor for an integration period,
measuring the TID signal and comparing it to a threshold that corresponds to the predetermined TID level in order to generate a TID measurement, and
latching the TID measurement;

returning to the step of measuring the TID signal in each sensing circuit if the latched TID measurements disagree;

returning to the step of integrating the dose in each sensing circuit if the latched TID measurements indicate a dose below the predetermined TID level; and shutting down the functional circuit if a minimum number of the latched TID measurements agree indicating a dose above the predetermined TID level.

25. The method of claim 24, wherein the integration period is terminated by a trigger signal.

26. The method of claim 24, wherein the integration period is terminated by a timer.

27. The method of claim 24, further comprising a step of removing the bias from the TID sensor before the step of measuring the TID signal.

28. The method of claim 24, wherein returning to the step of measuring the TID signal further comprises first returning to the step of integrating the dose.

29. The method of claim 24, wherein returning to the step of measuring the TID signal further comprises a step of resetting the latch in each sensing circuit to indicate a dose below the predetermined TID level.

30. The method of claim 24, wherein the step of shutting down the functional circuit is performed if at least two of the latched TID measurements indicate a dose above the predetermined TID level.

* * * * *